(12) United States Patent
Okubo et al.

(10) Patent No.: US 7,847,630 B2
(45) Date of Patent: Dec. 7, 2010

(54) AMPLIFIER

(75) Inventors: Yoichi Okubo, Tokyo (JP); Masaki Suto, Tokyo (JP); Yasuhiro Takeda, Tokyo (JP); Masaru Adachi, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 525 days.

(21) Appl. No.: 11/255,874

(22) Filed: Oct. 24, 2005

(65) Prior Publication Data

US 2006/0097783 A1 May 11, 2006

(30) Foreign Application Priority Data

Nov. 5, 2004 (JP) ............................. 2004-322092
Dec. 15, 2004 (JP) ............................. 2004-362826

(51) Int. Cl.
*H03F 3/28* (2006.01)
(52) U.S. Cl. ...................... 330/124 R; 330/84; 330/295
(58) Field of Classification Search ............ 330/124 R, 330/295, 84
See application file for complete search history.

(56) References Cited

U.S. PATENT DOCUMENTS

| 7,145,387 | B2 * | 12/2006 | Hellberg | 330/124 R |
| 7,382,186 | B2 * | 6/2008 | Apel et al. | 330/129 |
| 2004/0113698 | A1 | 6/2004 | Kim et al. | |
| 2006/0214732 | A1 * | 9/2006 | Pengelly et al. | 330/295 |

FOREIGN PATENT DOCUMENTS

| JP | 2000269040 | 9/2000 |
| JP | 2001127650 | 5/2001 |
| JP | 2002368716 | 12/2002 |
| JP | 2004173231 | 6/2004 |

OTHER PUBLICATIONS

Holt "Electronic Circuits Digital and Analog" John Wiley and Sons, Inc. 1978 p. 500.*
Yang et al., "Experimental Investigation on Efficiency and Linearity of Microwave Doherty Amplifier", 2001, IEEE, pp. 1-4.
Japanese Official Action issued in a counterpart Japanese Application No. 2005-319424 dated May 6, 2010.

* cited by examiner

*Primary Examiner*—Michael B Shingleton
(74) *Attorney, Agent, or Firm*—Bacon & Thomas, PLLC

(57) ABSTRACT

There is provided an amplifier for combining outputs of a plurality of amplifying circuits to generate an amplifier output. The amplifier includes a first amplifying circuit for operating a first amplifying device in class-AB, wherein the first amplifying circuit is one among the plurality of the amplifying circuits; a second amplifying circuit for operating a second amplifying device in class-B or class-C, wherein the second amplifying circuit is one among the plurality of the amplifying circuits; and a summing node at which an output of the first amplifying circuit is combined with an output of the second amplifying circuit via a first impedance transformer containing a transmission line of an electrical length other than $\lambda/4$. The second amplifying device is connected to the summing node via an output matching circuit and a second impedance transformer containing a transmission line.

4 Claims, 13 Drawing Sheets

THE ELECTRIC POWER VALUES GIVEN ABOVE REPRESENT AN EXEMPLARY CASE WHERE THE AMPLIFIER IS WITHIN THE RANGE A.

AMPLIFIER

FIELD OF THE INVENTION

The present invention relates to an amplifier; and, more particularly, to a modified Doherty amplifier capable of enhancing the performance thereof especially when an amplifying device or the like whose impedance matching is difficult in a conventional Doherty amplifier is employed, or capable of enhancing the power efficiency thereof.

BACKGROUND OF THE INVENTION

Conventionally, when a power-amplifying radio frequency signal such as a CDMA signal or a multi-carrier signal is amplified, a distortion compensation unit is added to a common amplifier, so that an operating range of the common amplifier can be expanded to include a saturation region to achieve a low power consumption. Although there are distortion compensation methods such as a feed-forward distortion compensation or a predistortion compensation, such methods have limitations to achieve the low power consumption. Therefore, Doherty amplifiers are recently attracting attentions as a candidate for a high efficiency amplifier.

FIG. 1 shows a configuration diagram of a conventional Doherty amplifier. A signal inputted to an input terminal 1 is divided by a divider 2. One of the divided signals is inputted to a carrier amplifying circuit 4. The carrier amplifying circuit 4 includes an input matching circuit 41 for implementing impedance matching to an input side of an amplifying device 42; the amplifying device 42, which contains, e.g., one or more transistors; and an output matching circuit 43 for implementing impedance matching to an output side of the amplifying device 42. A λ/4 transformer 61 is connected to an output terminal of the carrier amplifier 4 to transform an output impedance thereof.

The other divided signal is inputted to a peak amplifying circuit 5 after its phase is delayed by 90° by a phase converter 3. Similarly to the carrier amplifying circuit 4, the peak amplifying circuit 5 includes an input matching circuit 51; an amplifying device 52 containing, e.g., one or more transistors; and an output matching circuit 53.

An output signal of the λ/4 transformer 61 is combined with that of the peak amplifying circuit 5 at a summing node 62. The combined signal is transformed by a λ/4 transformer 7 such that an output impedance of the amplifier is matched to an output load 9, i.e., $Z_0$. The combination of the λ/4 transformer 61 and the summing node 62 is referred to as a Doherty combiner 6. An output of the λ/4 transformer 7 is applied via an amplifier output terminal 8 to the output load 9.

The carrier amplifying circuit 4 and the peak amplifying circuit 5 differ in that the amplifying device 42 is biased in class-AB whereas the amplifying device 52 is biased in class-B or class-C. Therefore, the amplifying device 42 operates alone until an input level of the amplifier reaches a region where it begins to be saturated and the amplifying device 52 starts to operate. That is, the amplifying device 52 starts to operate when a linearity of the amplifying device 42 starts to be rapidly deteriorated, so that an output signal of the amplifying device 52 is applied to the load to drive it together with the amplifying device 42. At this time, although a load line of the output matching circuit 43 moves from a high resistance to a low resistance as will be described later, the efficiency of the amplifying device 42 is high because the amplifying device 42 is in its saturation region.

When an input level from the input terminal 1 to the amplifier further increases, the amplifying device 52 also starts to be saturated. However, the efficiency of the amplifier remains to be high even at this time, because both the amplifying devices 42 and 52 are saturated.

FIG. 2 illustrates theoretically predicted values of a collector efficiency or drain efficiency of the Doherty amplifier shown in FIG. 1. The collector efficiency is defined as a radio frequency output power outputted by a collector of an amplifying transistor divided by a product of a DC voltage applied from a power supply to the collector and a DC current supplied from the power supply. Likewise, the drain efficiency is defined as a radio frequency output power outputted by a drain of an amplifying transistor divided by a product of a DC voltage applied from a power supply to the drain and a DC current supplied from the power supply.

The horizontal axis of the FIG. 2 represents an amplifier back-off, i.e., a dB ratio between a compression point and an input level of the amplifier when the compression point is set to be 0 dB, wherein the compression point is defined as a minimum input level for both the amplifying devices 42 and 52 to be saturated.

In FIG. 2, a dashed line represents the efficiency of a conventional class-B amplifier and a solid line represents the efficiency of a Doherty amplifier shown in FIG. 1.

When the input level of the amplifier is within a range A, the carrier amplifying circuit basically operates alone. When the amplifier back-off reaches about 6 dB, the carrier amplifying circuit 4 starts to be saturated and the efficiency of the Doherty amplifier reaches about a maximum efficiency of the conventional class-B amplifier. At this time, an output power of the carrier amplifying circuit 4 is about Po/4, wherein Po is a maximum output power of the Doherty amplifier.

In a range B where the amplifier back-off is between 0 dB and 6 dB, as the input level of the Doherty amplifier increases, the output power of the carrier amplifying circuit 4 increases from about 0.25Po to about 0.5Po and an output power of the peak amplifying circuit 5 increases from 0 to 0.5Po. Further, in the range B, the sum of the output power of the carrier amplifying circuit 4 and that of the peak amplifying circuit 5 is proportional to the input power of the Doherty amplifier with a same proportional constant as that of the range A. When the peak amplifying circuit 5 starts to operate, the efficiency of the Doherty amplifier decreases temporarily a little bit. However, the efficiency of the Doherty amplifier starts to increase again, so that it reaches its peak at the compression point where the peak amplifying circuit 5 starts to be saturated. At the compression point, the output power of the carrier amplifying circuit 4 is substantially equal to that of the peak amplifying circuit 5.

In general, CDMA signals and multi-carrier signals have a high peak factor, i.e., a ratio between the peak power and the average power. However, a conventional amplifier has an operating point below the compression point in order to correspond to a peak factor ranging from 7 dB to 12 dB.

In the following, components in the Doherty amplifier and their impedance will be described with reference to FIG. 1. Since the impedance of the output load Zo is a constant, it is set to be a reference value. If we let the input impedance of the λ/4 transformer 7 seen from the node 62 be defined as $Z_7$ and the characteristic impedance of the λ/4 transformer 7 be defined as $Z_2$, the following equation is established:

$$Z_7 = \frac{Z_2^2}{Z_O} \qquad \text{Eq. 1}$$

Thus, $Z_4$, which is the input impedance of the $\lambda/4$ transformer 61 seen from the output matching circuit 43, can be obtained as follows. In the range A, since the output impedance of the output matching circuit 53 is practically infinite, $Z_4$ and $Z_5$ can be obtained by following equations:

$$Z_4 = \frac{Z_1^2}{Z_7} = \frac{Z_1^2}{(Z_2^2/Z_O)} = Z_O \frac{Z_1^2}{Z_2^2} \text{ (in range } A) \quad \text{Eq. 2}$$

$$Z_5 = \infty \text{ (in range } A) \quad \text{Eq. 3}$$

wherein $Z_1$ is the characteristic impedance of the $\lambda/4$ transformer 61.

However, in a range C where the input level is higher than the compression point, $Z_7$ can be regarded as a parallel pair of the output impedance of the $\lambda/4$ transformer 61 seen from the node 62 and the output impedance of the output matching circuit 53, wherein said output impedances are equal. Therefore, in the range C, $Z_4$ and $Z_5$ can be obtained as:

$$Z_4 = \frac{Z_1^2}{2Z_7} = \frac{1}{2} Z_O \frac{Z_1^2}{Z_2^2} \text{ (in range } C) \quad \text{Eq. 4}$$

$$Z_5 = 2Z_7 \text{ (in range } C) \quad \text{Eq. 5}$$

In the range B, $Z_4$ and $Z_5$ vary within the limits of those in the ranges A and C.

The above result can be interpreted as follows. When the Doherty amplifier is applied in a high frequency operation, the value of $Z_4$ for a case when the input level is relatively high, i.e., in the range C, is half as large as that of $Z_4$ for a case when the input level is relatively low, i.e., in the range A. For example, if $Z_7=25\Omega$ and $Z_1=50\Omega$, $Z_4$ varies in the range of 100-50$\Omega$. Thus, the impedance of the amplifying device 42 also varies pursuant thereto.

Besides the conventional Doherty amplifier described above, there is known a modified Doherty amplifier capable of compensating the deterioration of its characteristics by controlling a gate bias voltage based on a drain current (for example, see Japanese Patent Laid-open Application No. 2004-260232).

Further, there is also known a modified Doherty amplifier in which all amplifying circuits are configured in two or more stages (for example, see Japanese Patent Laid-open Application No. 2004-173231).

Still further, there is also known a modified Doherty amplifier in which all harmonic components are combined to be cancelled out (for example, see Japanese Patent Laid-open Application No. H6-82998).

However, when the conventional Doherty amplifier is applied in a high frequency operation by using a semiconductor amplifying device, the impedance seen from the amplifying device 42 cannot be easily adjusted to make it agree with the value obtained based on Doherty theory because the load line seen from the amplifying device 42 varies in accordance with the behavior of the output matching circuit 43.

FIG. 3 is a Smith chart representing an exemplary variation of the load impedance. $Z_A$, $Z_B$ and $Z_C$ are load impedances of the amplifying device 42. These impedances are between 2$\Omega$ and 20$\Omega$ or less, noticeably small compared to $Z_4$, and not purely resistive. This Smith chart is normalized by a resistance arbitrarily chosen between $Z_A$ and $Z_4$. Three closed curves including $Z_A$ in their central portion are constant output power curves respectively representing 0.9 P, 0.5 P and 0.25 P, which show that the output power decreases as impedance matching becomes inaccurate. As shown therein, the maximum output power P can be obtained when the load impedance of the amplifying device 42 is $Z_A$.

Further, four dotted curves crossing the constant output power curves are constant efficiency curves respectively representing efficiencies a, b, c, and d, that decrease in this order.

The output matching circuit 43 transforms the load impedance of the amplifying device 42 into $Z_4$, i.e., the input impedance of the $\lambda/4$ transformer 61. The output matching circuit 43, if configured as a lumped element circuit, transforms an impedance pursuant to a constant resistance circle or constant conductance circle on the Smith chart. Although FIG. 3 depicts only two dashed curves as exemplary impedance transformation paths for simplicity, the actual paths of impedance transformation can be varied arbitrarily.

Since $Z_4$ decreases from $ZoZ_1^2/Z_2^2$, i.e., $Z_4(A)$, to $ZoZ_1^2/2Z_2^2$, i.e., $Z_4(C)$, as the input level increases, if $Z_4(C)$ is matched to $Z_A$ for obtaining the maximum output power in the range C, $Z_4(A)$ is matched to $Z_B$. However, considering that any impedance will result in an output power of 0.25Po as long as the impedance varies on the constant output power curve corresponding to 0.25Po, it is to be noticed that the case of matching to $Z_C$ is superior in efficiency to the case of matching to $Z_B$. That is, the amplifying device 42 operates most efficiently when the load impedance of the amplifying device 42 is transformed from $Z_C$ into $Z_A$ as the input level increases.

The above description is for the case where only output power and efficiency are taken into consideration. However, in general, a performance of an amplifier is described not only by output power and efficiency but also by gain and distortion. Even considering such impedance matching that satisfies specified conditions on output power, efficiency, gain and distortion of a specified kind of the amplifying device 42, there are some cases where it is more preferable that the load impedance of the amplifying device 42 varies outwardly than inwardly with respect to the center of the Smith chart as the input level increases. Further, there are also cases where it is preferable that the impedance varies to $Z_A$ from an arbitrary point having good characteristics.

However, sometimes it is difficult for a conventional matching circuit to transform $Z_4$, which varies inwardly with reference to the center of the Smith chart, into an impedance which varies outwardly with reference to the center of the Smith chart so that the two dashed curves representing the impedance transformation paths in FIG. 3 can cross each other. Therefore, in the conventional Doherty amplifier, the output matching circuit 43 can only implement such impedance matching as the impedance varies between $Z_B$ and $Z_A$, thereby imposing a limitation in enhancing the performance.

Further, in the conventional Doherty amplifier, when connecting plural amplifiers serially to implement a high-gain common amplifier, the dividing loss in the divider 2 becomes high and the power efficiency or the power added efficiency becomes low.

FIG. 10 is a configuration diagram of a conventional two-stage common amplifier. A signal amplified by a preamplifier 20 is divided into two signals by the divider 2 in a manner that the divided signals have a same efficiency, which means an occurrence of 3 dB loss. That is, since the input impedance varies pursuant to the input level in a complicated way, it is not possible for all the electric powers of the divided signals to be used effectively.

At least, within the range A, all the electric power distributed to the peak amplifying circuit 5 is dissipated. That is, most part of the electric power distributed to the peak amplifying circuit 5 is reflected, and the reflected waves are usually dissipated in, e.g., an isolator (not shown), or, if the divider 2 is Wilkinson type, in a dummy resistor (not shown). Further, within the range B, the electric power distributed to the peak amplifying circuit 5 is partly reflected. However, since the output power of a class-B or class-C amplifying circuit increases gradually and the reflection power decreases, the summation at the node 62 in FIG. 10 can be performed while the gain of the range A (that is, the linearity) is maintained.

Therefore, we need to take the above-mentioned loss about 3 dB, which will be referred to as "dividing loss," into account.

FIG. 11 presents a graph depicting the normalized input power and the output powers of the carrier amplifier 4, the peak amplifier 5 and both. FIG. 11 also shows an assumed output power of the carrier amplifier 4 as a single body in case of the dividing loss being zero. As shown therein, the output power of the peak amplifying circuit 5 increases rapidly in the vicinity of the amplifier back-off of 6 dB, so that, within the range B where the amplifier back-off is 6 dB or less, the carrier amplifying circuit 4 takes a share of the load together with the peak amplifying circuit 5. Further, we can see that, e.g., the gain is reduced significantly due to the dividing loss compared to a carrier amplifying circuit as a single body.

Hereinafter, it will be described how the power added efficiency of the common amplifier is calculated in case practical specifications of the preamplifier 20 and the Doherty amplifier 10 are assumed. The amplifier back-off is set to be a standard value (7 dB to 10 dB) so that the input power of the peak amplifying circuit 5 is dissipated sue to the reflection, and the preamplifier 20 is chosen to be a conventional class-AB amplifier instead of being the Doherty amplifier.

The specification of the Doherty amplifier 10 is as follows:
output power; 20 W
gain; 9 dB (including the dividing loss)
collector efficiency; 35%
input power; 2.5 W
The specification of the preamplifier 20 is as follows:
output power; 2.5 W (less than 20 W by 9 dB)
input power; 0.156 W
gain; 12 dB
collector efficiency; 20%
Thus, we obtain the following results:
the power consumption of the Doherty amplifier is 20/0.35=57.1 W;
the power consumption of the preamplifier is 2.5/0.2=12.5 W; and
the power added efficiency of the common amplifier is (20−0.156)/(57.1+12.5)=27.5%.

As can be seen above, although the collector efficiency of the Doherty amplifier is enhanced as high as 35%, the total power efficiency as the common amplifier is reduced to 27.5%.

Besides, though it is also possible to serially connect the Doherty amplifiers, multi-stage amplifier configuration causes deterioration in the performance because the Doherty amplifier includes the phase converter 3 and the Doherty combiner 6 and its characteristics vary widely with frequency.

SUMMARY OF THE INVENTION

It is, therefore, an object of the present invention to provide a modified Doherty amplifier, wherein its performance is superior to that of the conventional Doherty amplifier by implementing an appropriate impedance matching.

It is another object of the present invention to provide a modified Doherty amplifier, wherein its gain is large and its power added efficiency is at least substantially as high as that of the conventional Doherty amplifier.

In accordance with one aspect of the present invention, there is provided an amplifier for combining outputs of a plurality of amplifying circuits to generate an amplifier output, including a first amplifying circuit for operating a first amplifying device in class-AB, wherein the first amplifying circuit is one among the plurality of the amplifying circuits; a second amplifying circuit for operating a second amplifying device in class-B or class-C, wherein the second amplifying circuit is one among the plurality of the amplifying circuits; and a summing node at which an output of the first amplifying circuit is combined with an output of the second amplifying circuit via a first impedance transformer containing a transmission line of an electrical length other than $\lambda/4$.

Preferably, the second amplifying device is connected to the summing node via an output matching circuit and a second impedance transformer containing a transmission line.

Preferably, the amplifier further includes a divider for dividing an input signal of the amplifying circuit into more than one divided signals; a first preamplifier for amplifying one of the divided signals by operating in class-AB to send an amplified signal to the first amplifying circuit; and a second preamplifier for amplifying another of the divided signals by operating in class-AB, class-B or class-C to send an amplified signal to the second amplifying circuit.

In accordance with another aspect of the present invention, there is provided an amplifier including a divider for dividing an input signal of the amplifying circuit into at least two divided signals; a first preamplifier for amplifying one of the divided signals and a second preamplifier for amplifying another of the divided signals; a carrier amplifying circuit for amplifying an output of the first preamplifier; a peak amplifying circuit for amplifying an output of the second preamplifier if the output of the second preamplifier is higher than a threshold level; and a Doherty combiner for combining an output of the carrier amplifying circuit with an output of the peak amplifying circuit.

In accordance with still another aspect of the present invention, there is provided an amplifier including a divider for dividing an input signal of the amplifying circuit into two divided signals of substantially same electric power; a first preamplifier for amplifying one of the divided signals, wherein the first amplifier is biased in class-AB; a second preamplifier for amplifying the other of the divided signals, wherein the second amplifier is biased in class-C; a carrier amplifying circuit for amplifying an output of the first preamplifier, wherein the carrier amplifying circuit is biased in class-AB; a peak amplifying circuit for amplifying an output of the second preamplifier if the output of the second preamplifier is equal to or higher than a threshold level, wherein the peak amplifying circuit is biased in class-B or class-C; and a Doherty combiner for combining an output of the carrier amplifying circuit with an output of the peak amplifying circuit.

Preferably, the threshold level corresponds to a level lower than a compression point of the amplifier by 6 dB, an amount of a distortion of the first preamplifier is different from that of the second preamplifier, the peak amplifying circuit includes a semiconductor device, the carrier amplifying circuit includes another semiconductor device having a same configuration as that of the semiconductor device in the peak amplifying circuit, the saturation output level of the peak amplifying circuit is substantially same as that of the carrier amplifying circuit, and the Doherty combiner implement impedance transform by using a transmission line of a electrical length other than $\lambda/4$.

In accordance with still another aspect of the present invention, there is provided an amplifier, including a divider for dividing an input signal of the amplifying circuit into n divided signals; a first preamplifier for amplifying one of the divided signals, wherein the first amplifier is biased in class-AB; a second to an nth preamplifier for amplifying the other ones of the divided signals, wherein the second to the nth amplifier are biased in class-C; a carrier amplifying circuit for amplifying an output of the first preamplifier, wherein the carrier amplifying circuit is biased in class-AB; a second to nth peak amplifying circuit for amplifying outputs of the second to the nth preamplifier if the outputs of the second to the nth preamplifier are equal to or higher than a threshold level, wherein the second to the nth peak amplifying circuit are biased in class-B or class-C; and a Doherty combiner for combining an output of the carrier amplifying circuit and outputs of the second to the nth peak amplifying circuit with one another.

In accordance with still another aspect of the present invention, there is provided an amplifier including a divider for dividing an input signal of the amplifying circuit into two or more divided signals; one or more first preamplifiers for amplifying one of the divided signals, wherein at least one of the first preamplifiers is biased in class-AB; one or more sets of cascaded second preamplifiers for amplifying the other divided signals, wherein every set of the cascaded second preamplifiers is configured such that a front-end one of the second preamplifiers is biased in class-C; a carrier amplifying circuit for amplifying an output of the first preamplifier; one or more peak amplifying circuits for amplifying outputs of said one or more sets of the cascaded second preamplifiers if the outputs of said one or more sets of the second preamplifiers are higher than a threshold level; and a Doherty combiner for combining an output of the carrier amplifying circuit with outputs of said one or more peak amplifying circuits.

Preferably, the first preamplifiers are serially connected and a front-end one of the first preamplifiers is biased in class-C.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Hereinafter, preferred embodiments of the present invention will be described with reference to the drawings.

Embodiment 1

Figure 4:
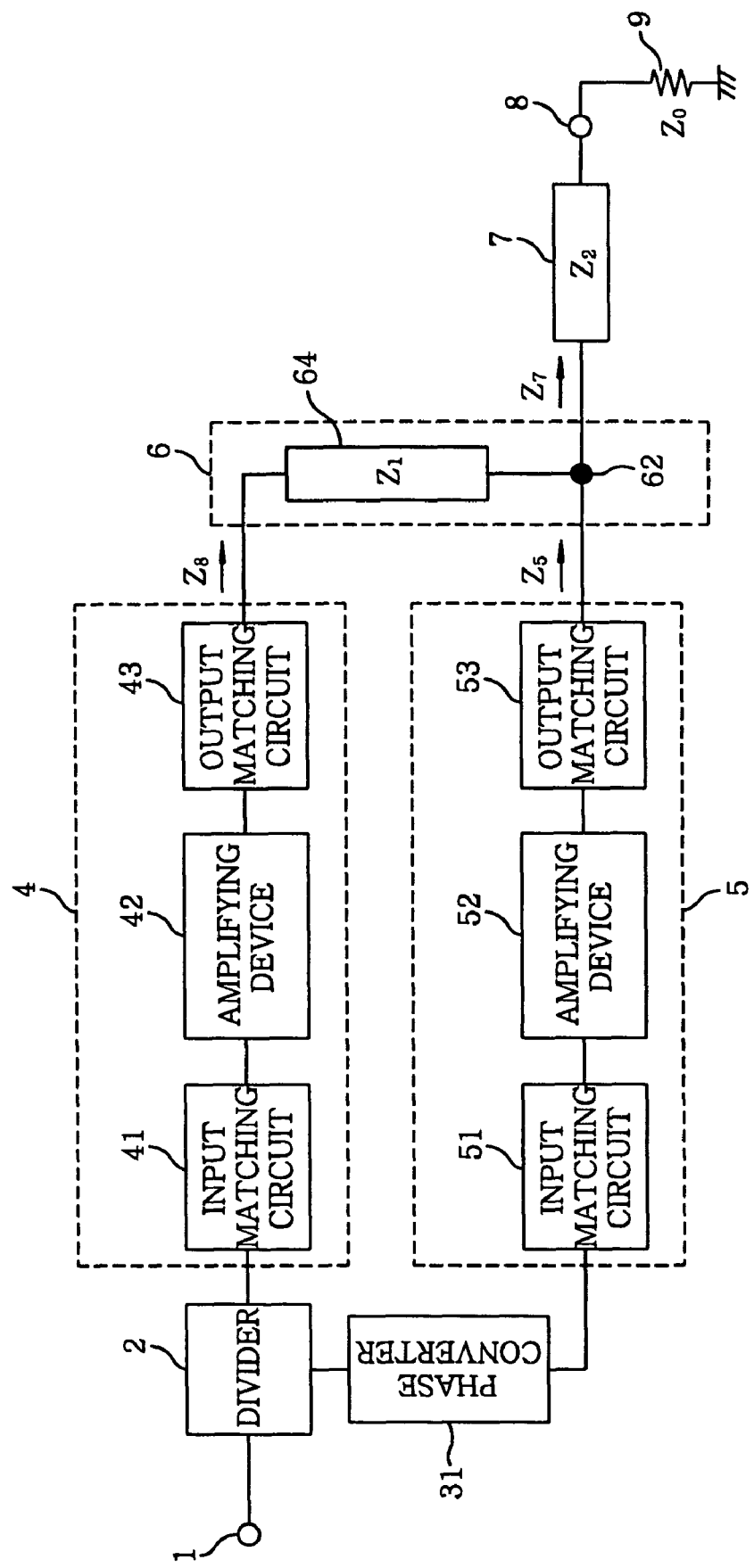
FIG. 4 describes a configuration diagram of an amplifier in accordance with a first embodiment of the present invention.

FIG. 4 describes a configuration diagram of an amplifier in accordance with a first embodiment of the present invention. An amplifier shown in FIG. 4 differs from that shown in FIG. 1 in that the λ/4 transformer 61 is replaced with an impedance transformer 64 configured with a piece of a transmission line of an arbitrary electrical length and the phase converter 3 is replaced with a phase converter 31. Other configurations of the amplifier shown in FIG. 4 are same as those of the amplifier shown in FIG. 1, except that specifications of some components may be different.

An input signal is inputted to an input terminal 1. The inputted signal is divided by a divider 2, which is, e.g., a 3 dB coupler or a T-branch line formed on a wiring board. The phase converter 31 is, in principle, a piece of a transmission line that can generate a delay corresponding to that of the impedance transformer 64. The phase converter 31 makes a phase of an output signal of the impedance transformer 64 be equal to that of an output matching circuit 53 when combining the output signal of the impedance transformer 64 with that of the output matching circuit 53 at a node 62. Since phase differences caused by the impedance transformer 64 as well as those caused by a carrier amplifying circuit 4 and a peak amplifying circuit 5 have to be calculated, the delay of the phase converter 31 may differ from that of the impedance transformer 64.

The carrier amplifying circuit 4 includes an input matching circuit 41 for implementing impedance matching to an input side of an amplifying device 42; the amplifying device 42, which contains, e.g., one or more transistors; and an output matching circuit 43 for implementing impedance matching to an output side of the amplifying device 42. The impedance transformer 64 is connected to an output terminal of the carrier amplifier 4 to transform an output impedance thereof. The amplifying device 42 for amplifying signals is biased in class-AB. Within the range A, the output matching circuit 43, together with the impedance transformer 64, transforms a load impedance of the amplifying device 42 into an impedance on an approximately circular curve enclosing $Z_A$ at its central portion. Within the range C, the output matching circuit 43, together with the impedance transformer 64, transforms the load impedance of the amplifying device 42 into $Z_A$.

The other of the divided signals is inputted to the peak amplifying circuit 5 after its phase is delayed by the phase converter 31. Like the carrier amplifying circuit 4, the peak amplifying circuit 5 includes an input matching circuit 51; an amplifying device 52 containing, e.g., one or more transistors; and an output matching circuit 53. The amplifying device 52 is biased in class-B or class-C. Usually, the amplifying devices 42 and 52 are semiconductor devices such as LD-MOS (Lateral Double-diffused MOS), GaAs-FET, HEMT or HBT. Within the range A, the output matching circuit 53 transforms a load impedance of the amplifying device 52 into $Z_5$. Within the range C, the output matching circuit 53 transforms the load impedance of the amplifying device 52 into a substantially infinite value. The input matching circuits 41 and 51 and the output matching circuits 43 and 53 may be configured as lumped constant circuits, distributed constant circuits, or combinations thereof. Further, the output matching circuits 43 and 53 may include stray capacitances or inductances.

Figure 6:
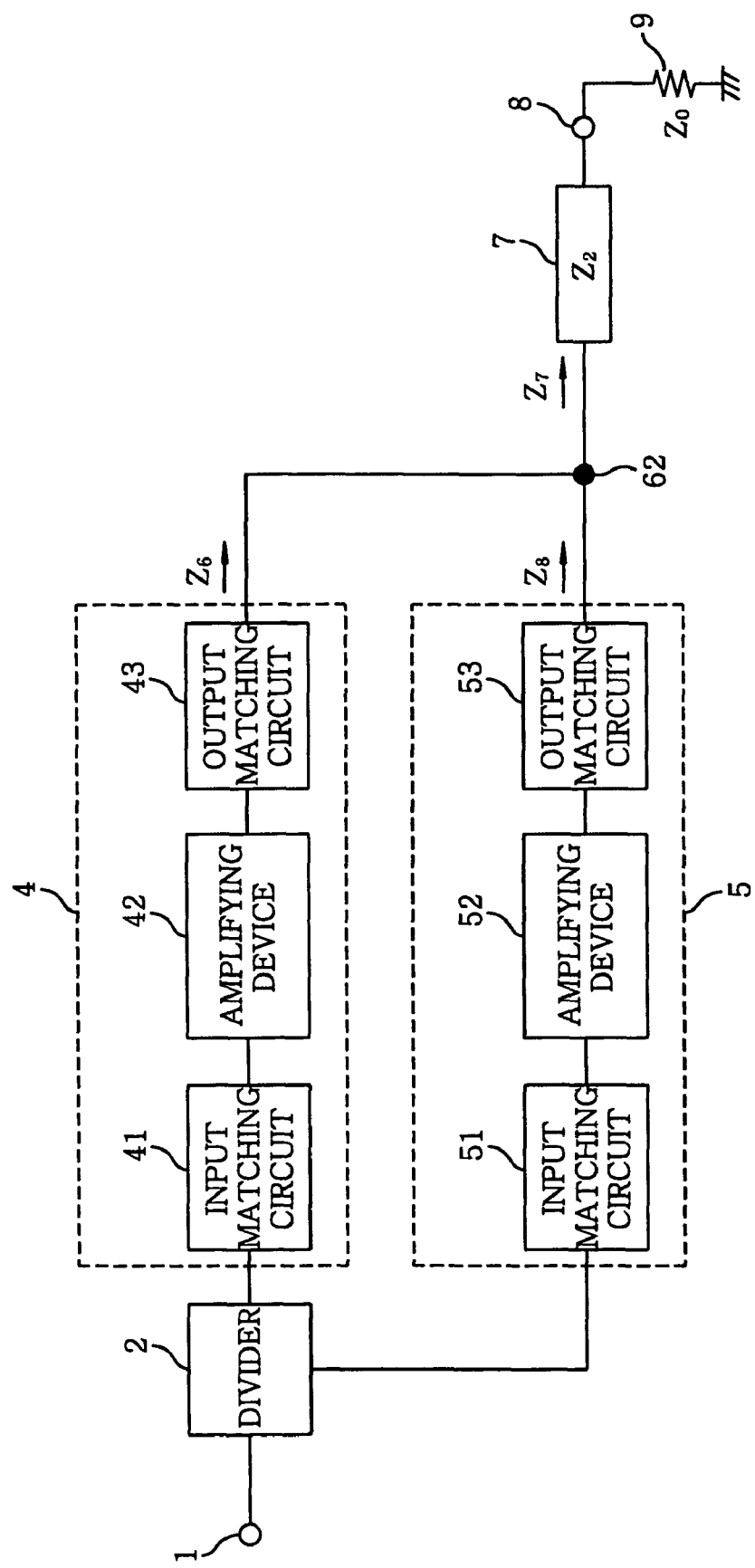
FIG. 6 shows a configuration diagram of an amplifier in accordance with the first embodiment of the present invention in case the electrical length of the impedance transformer is zero.

An output signal of the impedance transformer 64 is combined with that of the output matching circuit 53 at the summing node 62. The impedance transformer 64 is a piece of a transmission line with an electrical length l of 0~$\lambda/2$ or longer. In case the electrical length of the impedance transformer 64 is zero, it is same as ideal conducting wire as shown in FIG. 6. $Z_1$, i.e., the characteristic impedance of the impedance transformer 64, is equal to $2Z_7=2Z_2^2/Z_0$.

The signal combined at the node 62 is inputted to a $\lambda/4$ transformer 7, which transforms $Z_7$, i.e., an input impedance of the $\lambda/4$ transformer 7 seen from the node 62, into $Z_0$, i.e., an output load impedance. The $\lambda/4$ transformer 7 may be configured as conductor patterns formed on a wiring board of a width corresponding to a characteristic impedance $Z_2$ and a length corresponding to an electrical length $\lambda/4$. Although impedance matching can be implemented within a relatively wide frequency range by using the $\lambda/4$ transformer, it is also possible to use other devices than the $\lambda/4$ transformer as long as impedance matching can be implemented.

Figure 5:
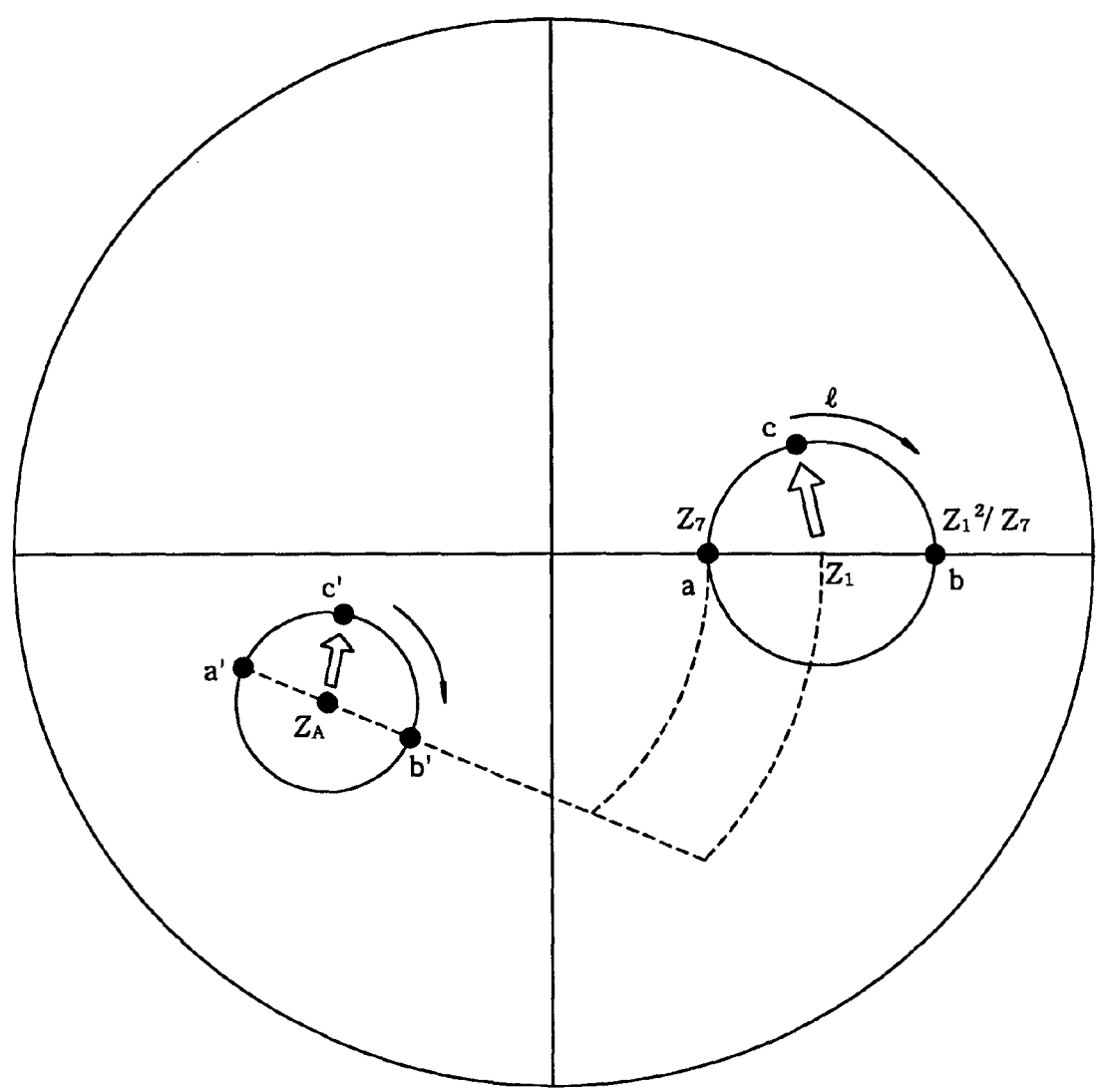
FIG. 5 presents a Smith chart describing impedance matching by using the output matching circuit 43 and the impedance transformer 64.

FIG. 5 presents a Smith chart describing impedance matching by using the output matching circuit 43 and the impedance transformer 64. The output matching circuit 43 is configured such that an output power thereof is Po (which is a maximum power of the carrier amplifier 4 as a single body) when a load impedance $Z_9$ of the output matching circuit 43 is equal to $Z_1$. That is, within the range C, the load impedance of the amplifying device 42 is matched to $Z_A$, wherein the impedance transformer 64 functions as a piece of a transmission line.

Within the range A, an output impedance of the output matching circuit 53 is substantially infinite. Therefore, $Z_9$ is transformed into $Z_7$ represented by a point a in case of l=0 or $\lambda/2$ and $Z_1^2/Z_7$ represented by a point b in case of l=$\lambda/4$. Further, if l varies within the range between 0 and $\lambda/2$, $Z_9$ varies clockwise along a circle centered at $Z_1$.

An impedance represented by the circle centered at $Z_1$ is mapped on an approximately circular curve enclosing $Z_A$ at its central portion by the output matching circuit 43. Points a, b and c correspond respectively to points a', b' hand c', which means that the impedance can be transformed into a', b' and c' by varying l. Therefore, it is preferable to set l such that c' is the point where the performance of the carrier amplifying circuit or the amplifier is the most preferable. The optimal value of l is determined by, e.g., trial and error. The trial may be performed to observe the performance of the carrier amplifying circuit as a single body. However, it is more preferable that the trial is performed to observe the performance of the whole amplifier.

In accordance with the embodiment 1, the impedance matching can be implemented by only varying l even when the optimal point varies along the approximately circular curve enclosing $Z_A$ at its central portion, regardless of the type of the amplifying device and so forth.

FIG. 6 shows a configuration diagram of an amplifier in accordance with the first embodiment of the present invention in case the electrical length l of the impedance transformer is zero. The configuration shown in FIG. 6 can be used when it is preferable to have the loss in the impedance transformer 64 to be zero, depending on the conditions of the devices.

Further, although the electrical length l is 0 to $\lambda/2$ in the above description, l can be longer than $\lambda/2$. In addition, $Z_1$ does not have to be exactly equal to $2Z_7$ and sometimes may slightly differ therefrom.

Embodiment 2

Figure 7:
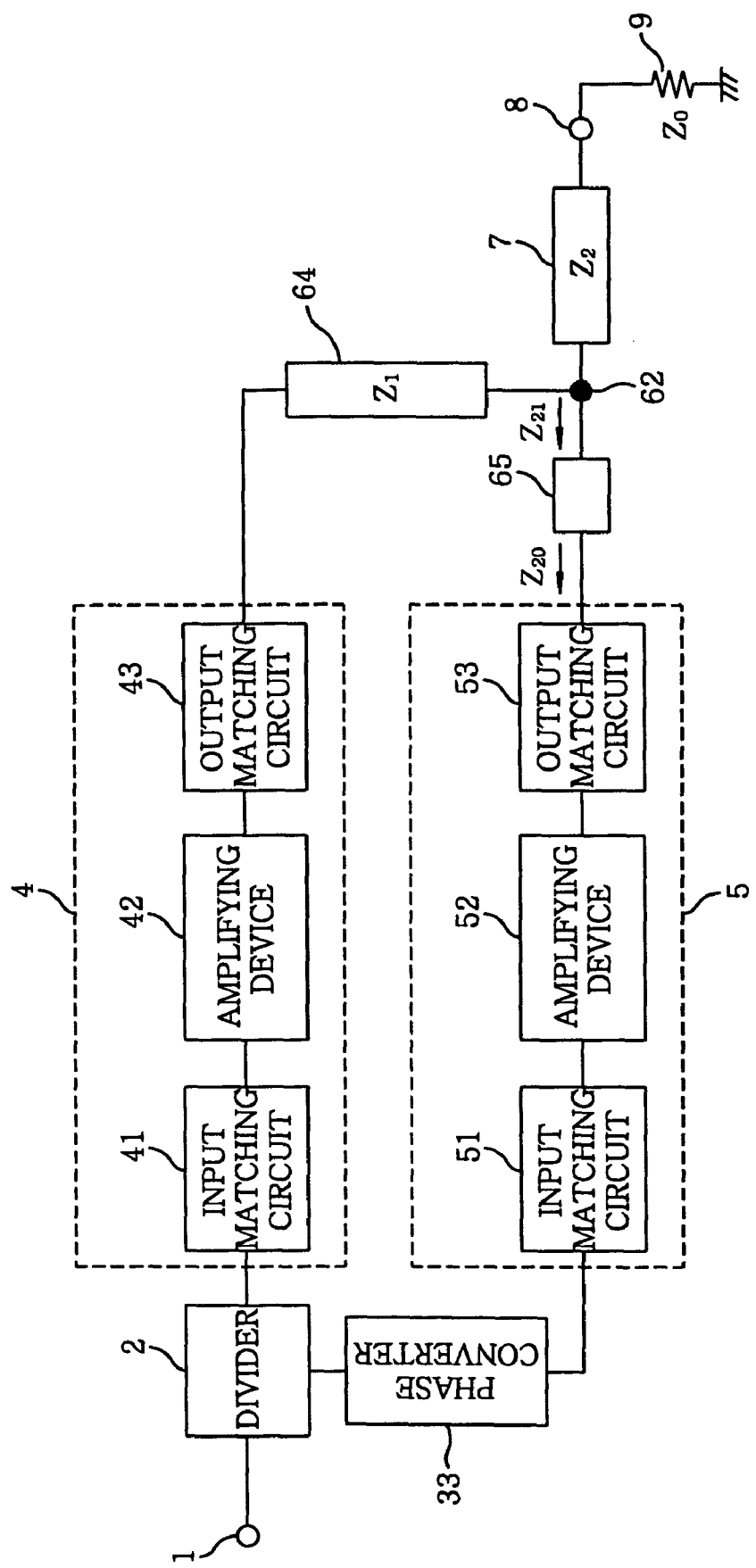
FIG. 7 illustrates a configuration diagram of an amplifier in accordance with a second embodiment of the present invention.

FIG. 7 illustrates a configuration diagram of an amplifier in accordance with a second embodiment of the present invention. The amplifier shown in FIG. 7 differs from that shown in FIG. 4 in that an impedance transformer 65 is connected between an output matching circuit 53 and a node 62 and the phase converter 31 is replaced with a phase converter 33. Other configurations of the amplifier shown in FIG. 7 are same as those of the amplifier shown in FIG. 4, except that specifications of some components may be different.

The impedance transformer 65 transforms an output impedance $Z_{20}$ of an output matching circuit 53 into a larger value $Z_{21}$ when an amplifying device 52 does not operate as an input level thereof is low, thereby suppressing a signal flowing into a carrier amplifying circuit 4. The impedance transformer 65 is, for example, of an arbitrary length of a transmission line same as an impedance transformer 64.

The phase converter 33 generates a phase delay corresponding to that of the impedance transformer 65. The phase converter 33 may be inserted in the carrier amplifying circuit 4 in case phases of the amplifying circuit 4 differ greatly from those of a peak amplifying circuit 5. The phase converter 33 adjusts the phase differences caused by the impedance transformer 64, the carrier amplifying circuit 4 and the peak amplifying circuit 5.

In accordance with the first embodiment, the output impedance of the conventional output matching circuit 53 does not become sufficiently large when the input level is small, thereby causing a power loss in the carrier amplifying circuit 4. However, in accordance with the second embodiment, an output impedance of the peak amplifying circuit 5 seen from the node 62 can be made larger by adding the impedance transformer 65, so that the power loss of the carrier amplifying circuit 4 can be suppressed.

Embodiment 3

Figure 8:
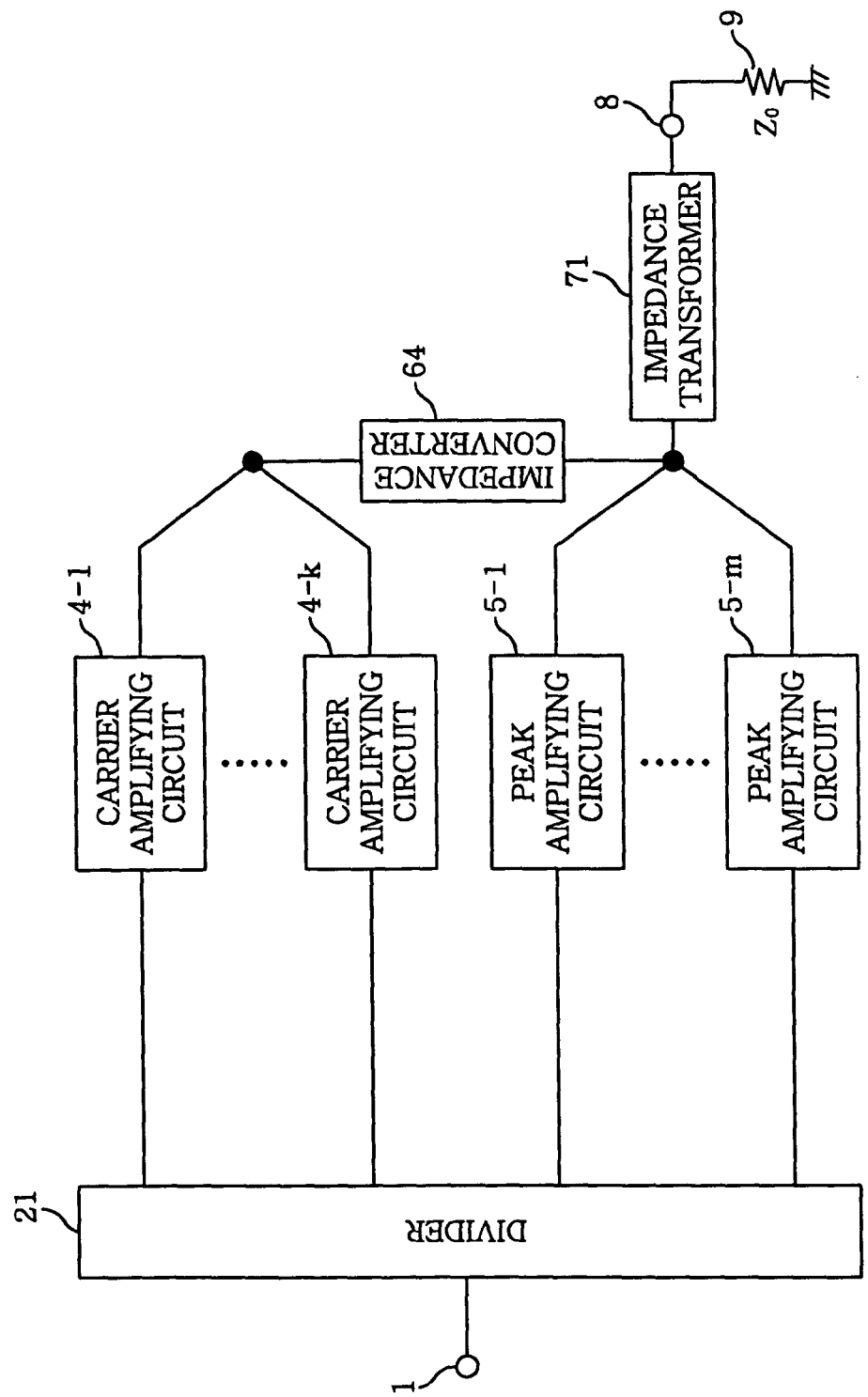
FIG. 8 provides a configuration diagram of an amplifier in accordance with a third embodiment of the present invention.

FIG. 8 provides a configuration diagram of an amplifier in accordance with a third embodiment of the present invention. The amplifier shown in FIG. 8 differs from that shown in FIG. 4 in that a plurality of carrier amplifying circuits or a plurality of peak amplifying circuits are provided therein, the divider 2 is replaced with a divider 21, and the $\lambda/4$ transformer 7 is replaced with an impedance transformer 71. Other configurations of the amplifier shown in FIG. 8 are same as those in the amplifier shown in FIG. 4, except that specifications of some components may be different. This embodiment is preferable especially when two amplifiers cannot provide a large enough output power needed.

The divider 21 divides a signal inputted to an input terminal 1 by n. 4-1, 4-2, . . . 4-$k$ (0<k<n) are k carrier amplifying circuits corresponding to the carrier amplifying circuit 4 in FIG. 4. 5-1, 5-2, . . . 5-$m$ are m peak amplifying circuits corresponding to the peak amplifying circuit 5 in FIG. 4. It is also possible for 4-1 to 4-k and 5-1 to 5-m are connected to an impedance transformer 65 or a phase converter 33 same as that shown in FIG. 7. Although not shown in FIG. 8, phases of outputs of the carrier amplifying circuits 4-1 to 4-k and the peak amplifying circuits 5-1 to 5-m are adjusted such that these outputs can be combined at a summing node with a same phase. The impedance transformer 71 transforms an output impedance of the amplifier into Zo. The impedance transformer 71 is, for example, a λ/4 transformer.

In accordance with the third embodiment, the input signal is divided by n by the divider 21, k of which are amplified by class-AB amplifiers operating within a range from a small signal input to a large signal input, and m of which are amplified by class-B or class-C amplifiers operating within a range of a large signal input. The peak amplifiers may start operations at a same input level. However, it is also possible that the peak amplifiers have different bias levels and start the operations one by one as the input level increases.

Embodiment 4

Figure 9:
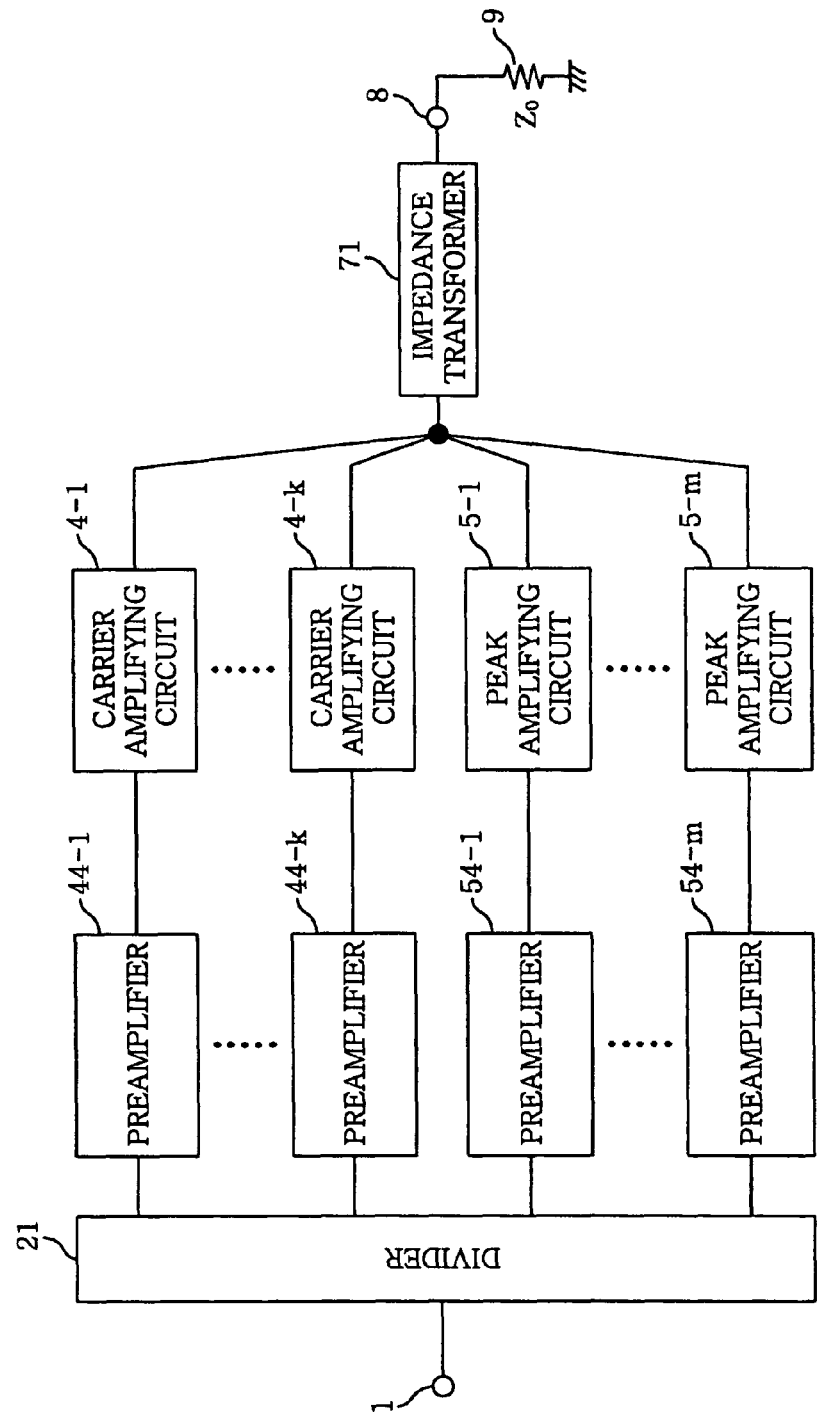
FIG. 9 shows a configuration diagram of an amplifier in accordance with a fourth embodiment of the present invention.

FIG. 9 shows a configuration diagram of an amplifier in accordance with a fourth embodiment of the present invention. The amplifier shown in FIG. 9 differs from that shown in FIG. 8 in that preamplifiers are serially connected to carrier amplifiers or peak amplifiers. This embodiment can improve the power efficiency.

In general, amplifiers use a plurality of amplifying devices to obtain a sufficiently high gain. For example, preamplifiers may be serially connected to the amplifiers shown in FIG. 4, 6 or 7. However, since the amplifiers shown in FIGS. 4, 6 and 7 include the divider 2, the electric power transferred to the peak amplifying circuit is not effectively used but reflected in case of the amplifiers shown in FIG. 4, 6 or 7 are within the range C where the peak amplifying circuit does not operate. That is, although a signal amplified by a preamplifier is inputted to an input terminal 1, an input power thereof is partly dissipated by, at worst, 3 dB. The power added efficiency of the conventional Doherty amplifiers is reduced due to this dividing loss.

Figure 1:
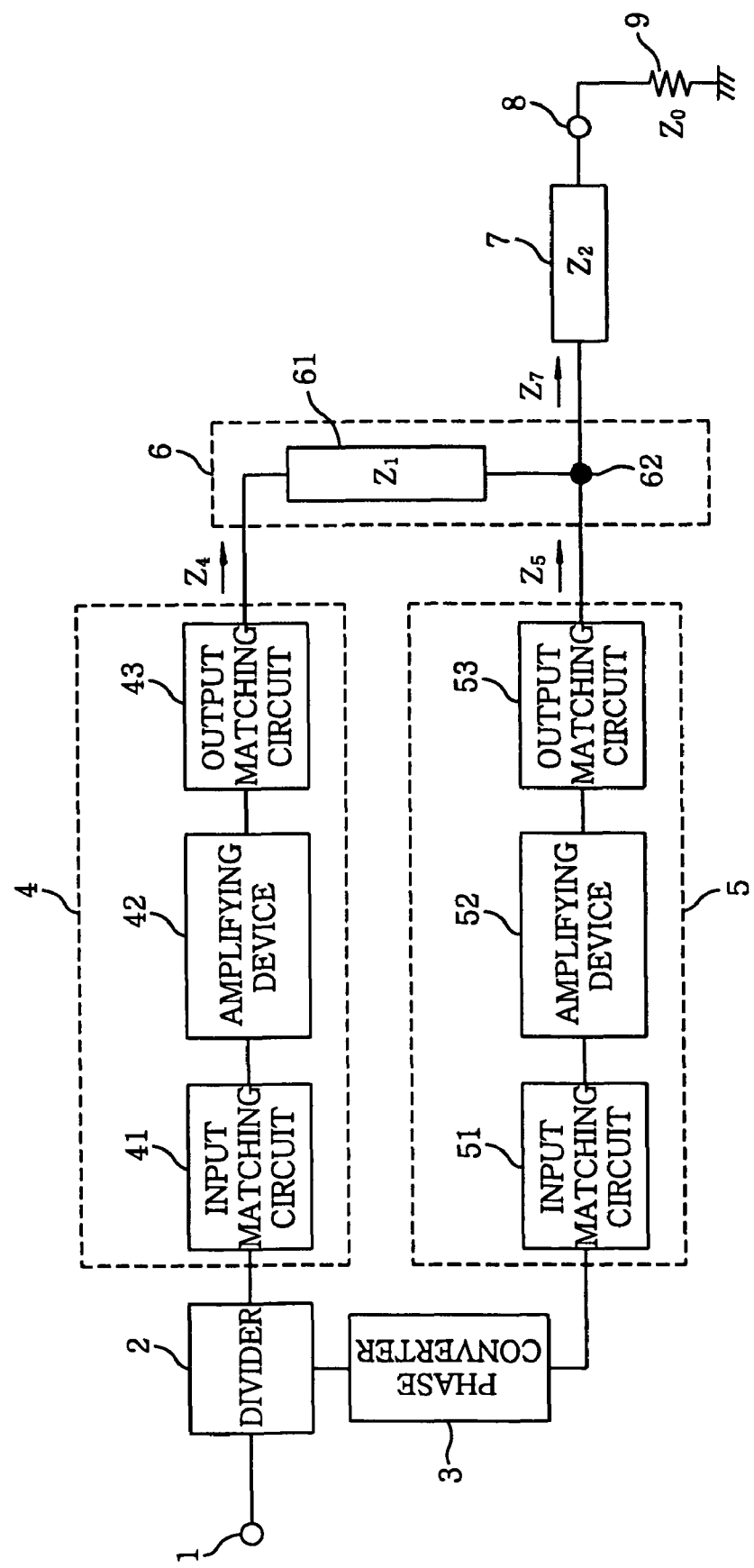
FIG. 1 shows a configuration diagram of a conventional Doherty amplifier.
Figure 2:
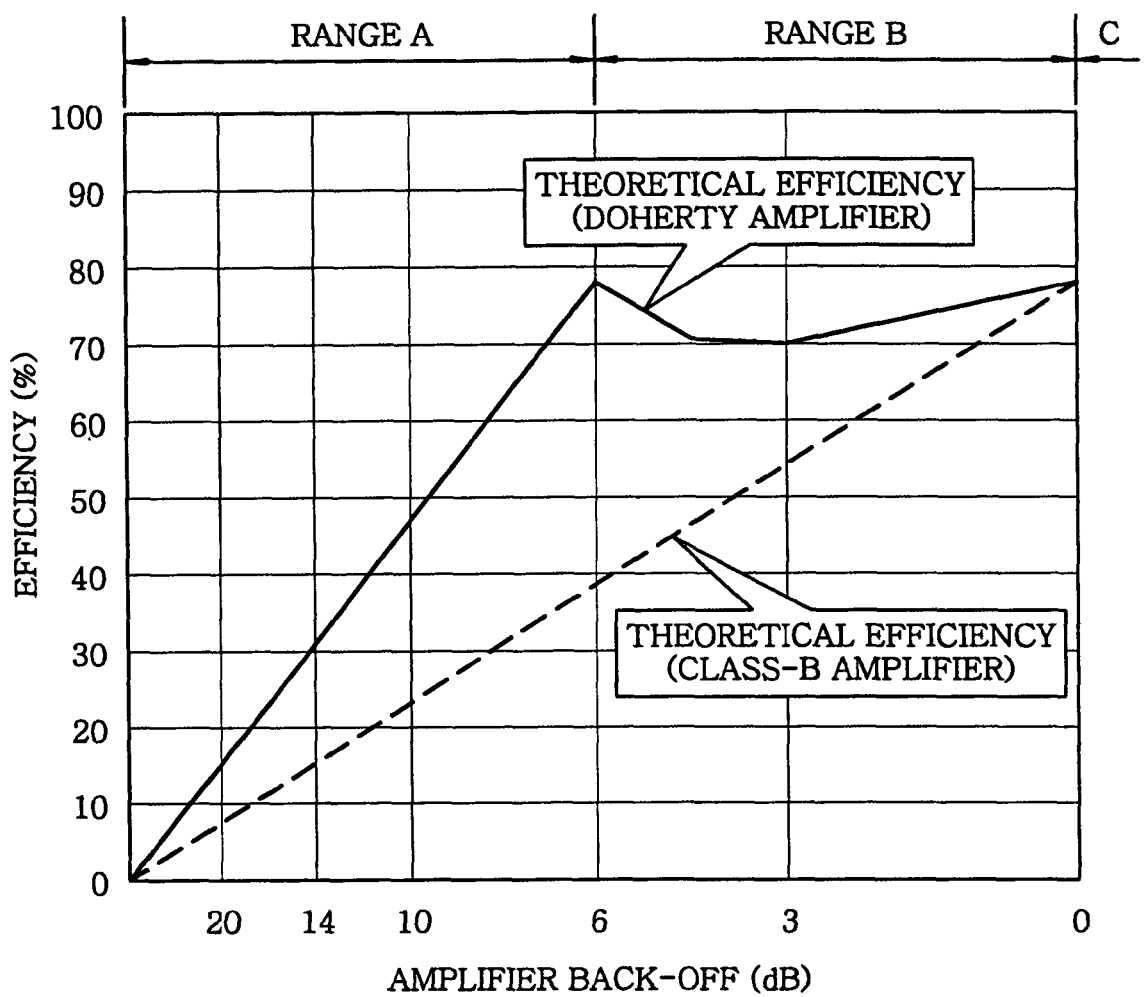
FIG. 2 illustrates theoretically predicted values of the collector efficiency or drain efficiency of the Doherty amplifier shown in FIG. 1.

In FIG. 9, 44-1 to 44-k and 54-1 to 54-m are preamplifiers, which are respectively connected between the divider 21 and amplifying circuit 4-1 to 4-k and 5-1 to 5-m. If necessary, these preamplifiers may have input matching circuits or output matching circuits. These preamplifiers may have a same configuration, or may be biased for different classes. Further, these preamplifiers may be connected in a multi-stage manner. It is also possible for a plurality of preamplifiers, e.g., 44-1 to 44-k to be united as a common preamplifier.

In accordance with the fourth embodiment, an input signal is divided by the divider 21 while the input signal is at a small level, thereby reducing the dividing loss to improve the power efficiency of the amplifier. This is noticeable especially when the gain of, e.g., an amplifying device 42 is small.

The amplifiers in accordance with the first to fourth embodiment can enhance the performance compared to the conventional Doherty amplifier by properly adjusting impedance matching.

Embodiment 5

Figure 12:
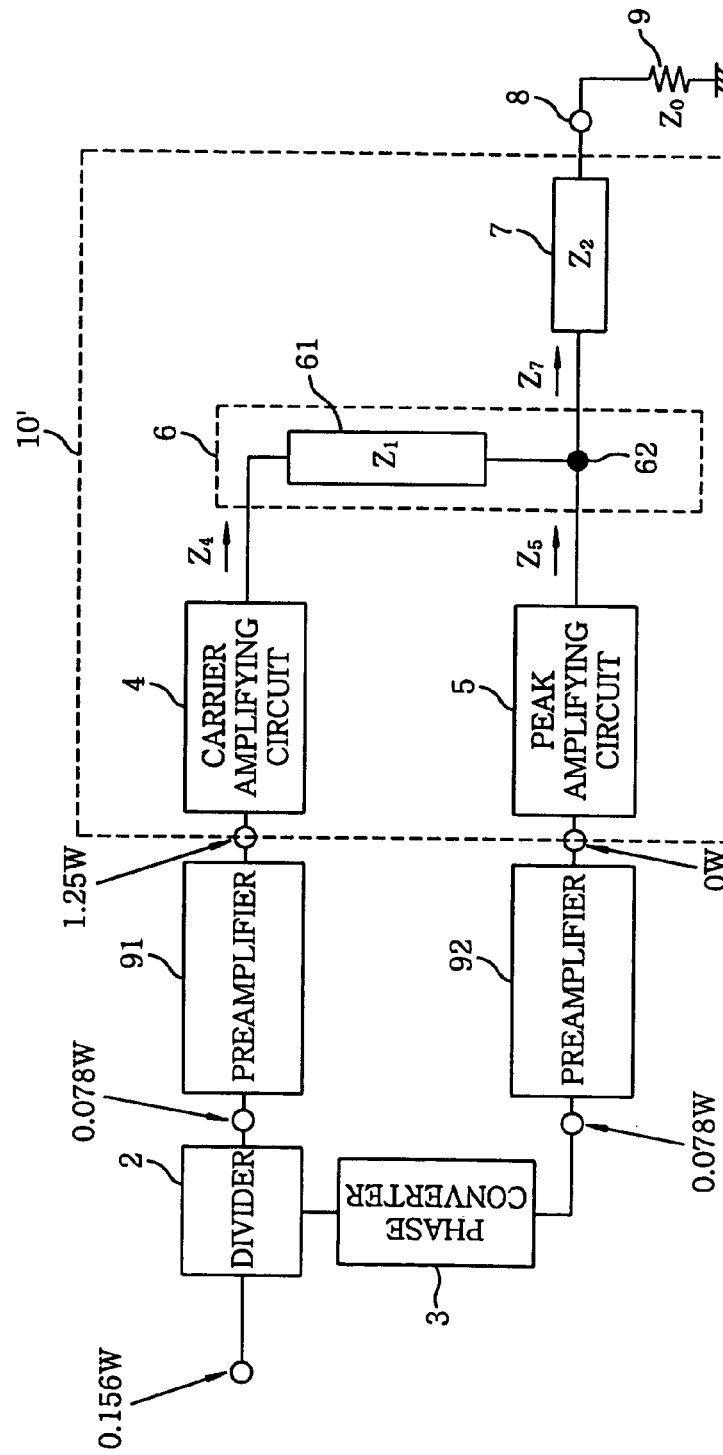
FIG. 12 describes a configuration diagram of a common amplifier in accordance with a fifth embodiment of the present invention.

FIG. 12 describes a configuration diagram of a common amplifier in accordance with a fifth embodiment of the present invention. The common amplifier shown in FIG. 12 differs from that shown in FIG. 10 in that two preamplifiers 91 and 92 are installed between the divider 2 and the amplifying circuits 4 and 5. In FIG. 12, components that have same reference numerals as FIG. 10 have same specifications as those in FIG. 10.

10' is a latter part of the conventional Doherty amplifier. Herein, the latter part of the conventional Doherty amplifier has the same configuration as that of the conventional Doherty amplifier, except that the divider 2 and the phase converter 3 are not included therein. An inputted signal is divided by the divider 2, which is, e.g., a Wilkinson divider formed on a wiring board. The phase converter 3 can generate a time delay or phase delay corresponding to those of the λ/4 transformer 61. The phase converter 3 adjusts phase differences caused by the impedance transformer 64, the carrier amplifying circuit 4 and the peak amplifying circuit 5. The phase converter 31 makes a phase of the output signal of the λ/4 transformer 61 be equal to that of the peak amplifying circuit 5 when combining the output signals of the λ/4 transformer 61 with that of the peak amplifying circuit 5 at the node 62. Since time differences or phase differences may be caused by not only the λ/4 transformer 61 but also the preamplifiers 91 and 92 and the amplifying circuits 4 and 5, the time delay or phase delay of the phase converter 31 may differ from that of the λ/4 transformer 61. The phase converter 3 may be configured such that the time delay or phase delay can be electrically controlled.

The preamplifier 91 for receiving one of the divided signals to amplify the received signal is biased in class-AB to maintain sufficient linearity needed for input signals of the carrier amplifying circuit 4. The amplifier back-off of the preamplifier 91 is designed to be, e.g., substantially same as or slightly greater than that of the carrier amplifying circuit 4.

The preamplifier 92 for receiving the other divided signal to amplify the received signal is biased in class-C to maintain sufficient linearity needed for input signals of the peak amplifying circuit 5. Therefore, the output signal of the preamplifier 91 may differ from that of the preamplifier 92.

The carrier amplifying circuit 4 receives the output signal of the preamplifier 91 to amplify the received signal, and the peak amplifying circuit 5 receives the output signal of the preamplifier 92 to amplify the received signal. Usually, the amplifying devices used for the preamplifiers 91 and 92 and the amplifying circuits 4 and 5 are semiconductor devices such as LD-MOS (Lateral Double-diffused MOS), GaAs-FET, HEMT or HBT. The amplifying devices used for the carrier amplifying circuits 4 may have a substantially same specification as that of the peak amplifying circuits 5.

The λ/4 transformer 61 contains a transmission line for implementing impedance matching. Instead of the λ/4 transformer 61, an impedance transformer made of a transmission line in a manner similar to that of FIG. 4 may be used for implementing impedance matching, wherein the transmission line has the electrical length l of 0~λ/2 or longer and the characteristic impedance thereof is $Z_1 = 2Z_2^2/Z_o$.

Output signals of the λ/4 transformer 61 and the peak amplifying circuit 5 are combined at the summing node 62. The signal combined at the node 62 is inputted to the λ/4 transformer 7, which transforms $Z_7$, i.e., the input impedance of the λ/4 transformer 7 seen from the node 62, into $Z_0$, i.e., the output load impedance. The λ/4 transformer 7 may be configured as conductor patterns formed on a wiring board with a width corresponding to the characteristic impedance $Z_2$ and a length corresponding to the electrical length λ/4. Although impedance matching can be implemented throughout a relatively wide frequency range by using the λ/4 transformer, it is also possible to use other devices than the λ/4 transformer as long as impedance matching can be implemented.

Figure 3:
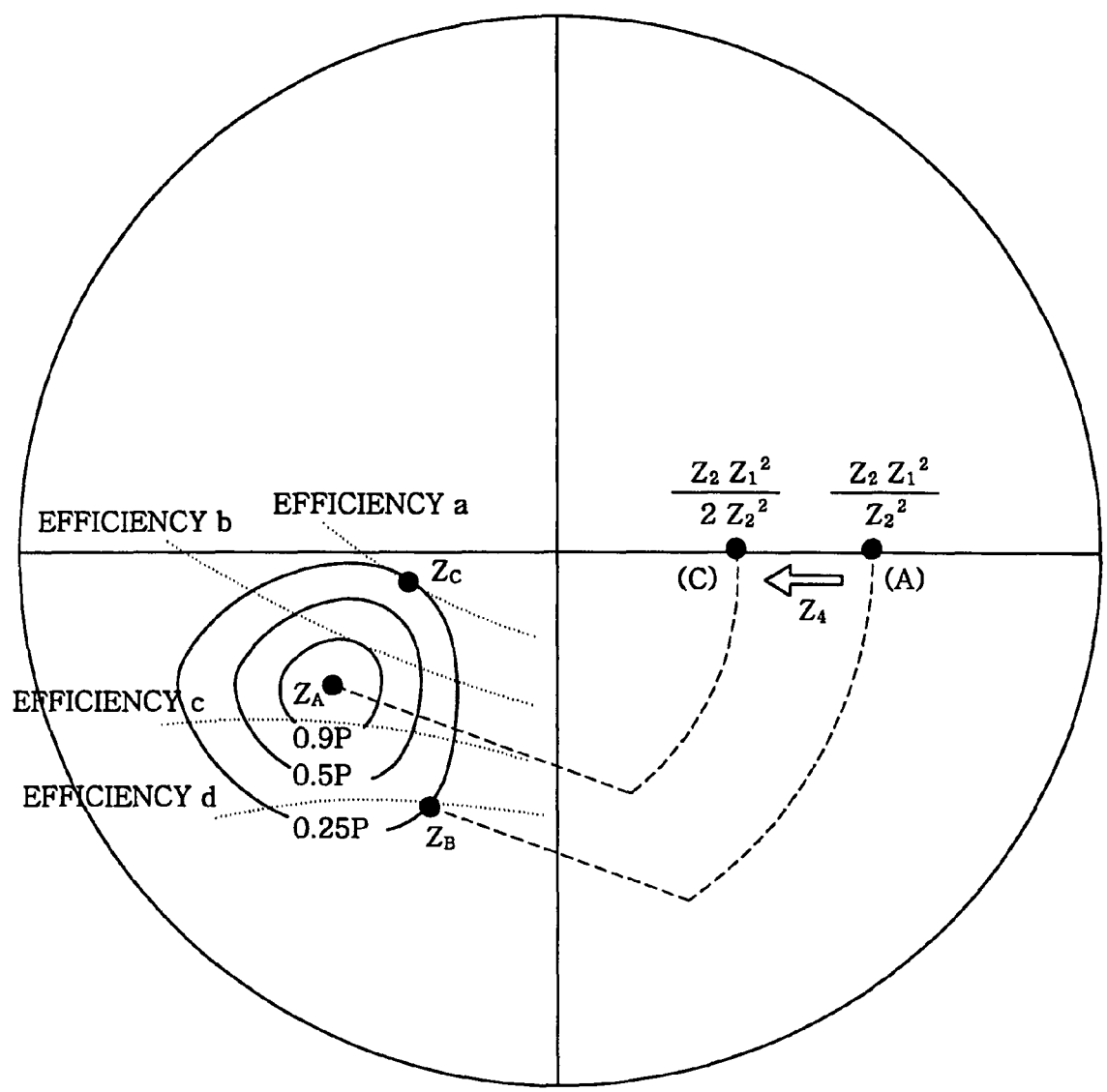
FIG. 3 is a Smith chart representing an exemplary variation of the load impedance.

Hereinafter, the power added efficiency of the common amplifier shown in FIG. 12 will be estimated. The characteristics of each component therein is assumed to be same as its corresponding component in FIG. 10, and the output level of the common amplifier is assumed to be a constant as long as the input level is a constant. The preamplifiers 91 and 92 are configured to be biased in class-AB and class-C, respectively. The configuration of the preamplifiers 91 is same as that of the preamplifier 92. The efficiency and the gain of the preamplifiers 91 and 92 are same as the preamplifier 20 in FIG. 10 but the output level of the preamplifiers 91 and 92 is lower than that of the preamplifier 20. The input level and output level of the common amplifier shown in FIG. 3 are set to be same as those of the common amplifier shown in FIG. 5.

The specification of the latter part of the Doherty amplifier 10' is as follows:
output power; 20 W
gain; 12 dB (increased by 3 dB due to the absence of the divider)
collector efficiency; 35%
The specification of the preamplifier 91 is as follows:
output power; 1.25 W
input power; 0.078 W
gain; 12 dB
collector efficiency; 20%

The preamplifier 92 does not perform an amplification at the back-off of 7 to 10 dB. The impedance of the preamplifier 91 is properly matched to that of the carrier amplifying circuit 4, so that the power loss therebetween is negligible. Remarkably, the electric power dissipated in the peak amplifying circuit 5 when the amplifier is in the range A decreases from 1.25 W to 0.078 W.

Thus, we obtain the following results:
the power consumption of the Doherty amplifier is 20/0.35=57.1 W;
the power consumption of the preamplifier is 1.25/0.2=6.25 W; and
the power added efficiency of the common amplifier is (20−0.156)/(57.1+6.25)=31.3%.

Figure 10:
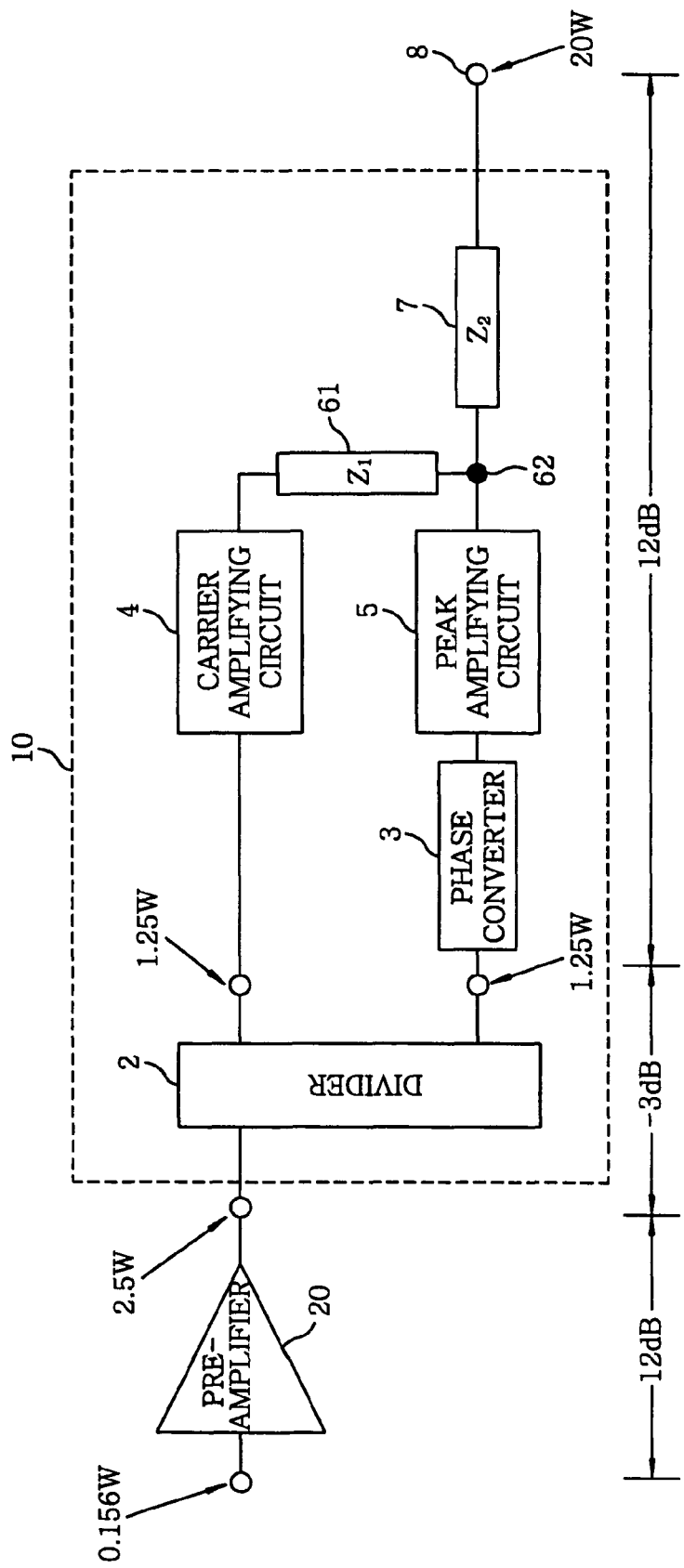
FIG. 10 is a configuration diagram of a conventional two-stage common amplifier.
Figure 11:
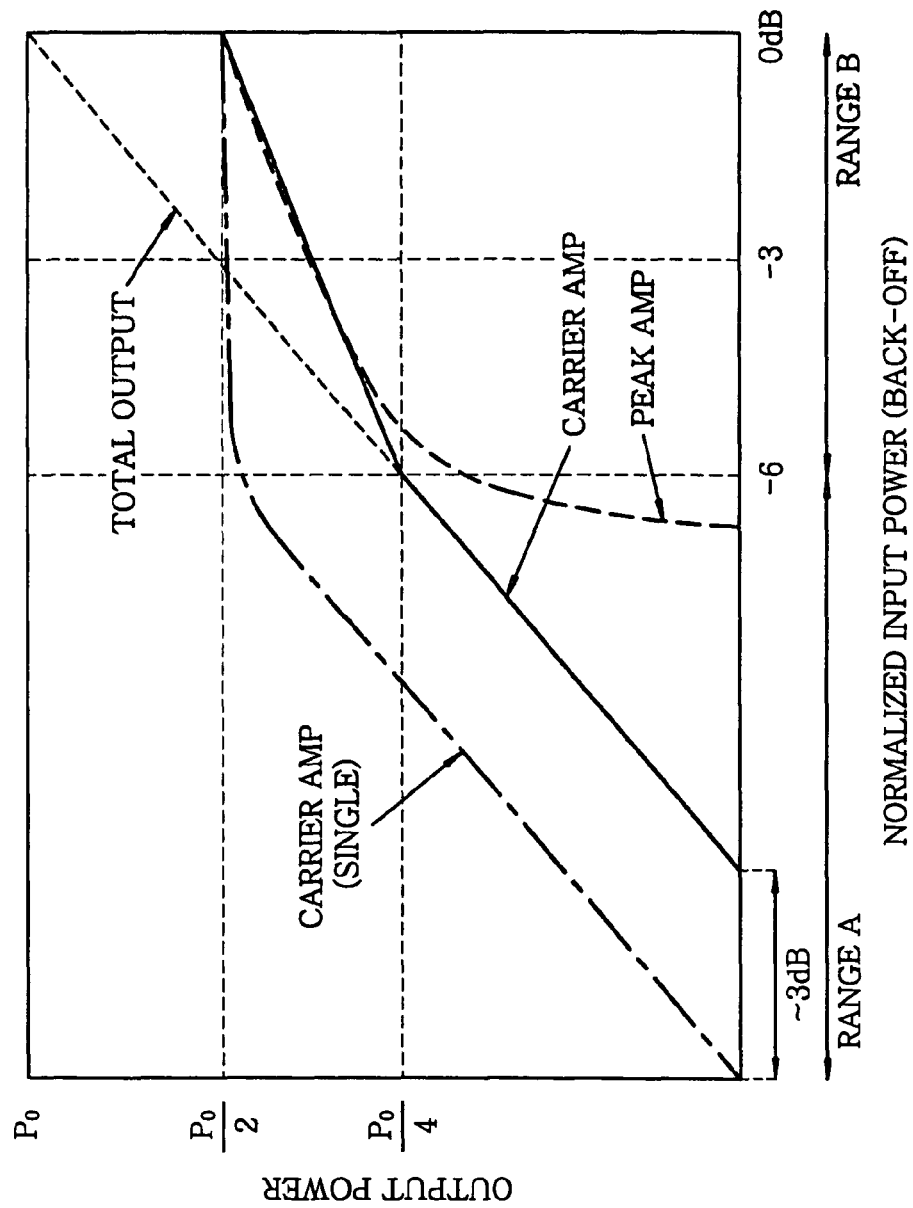
FIG. 11 presents a graph depicting the output powers of the carrier amplifier 4, the peak amplifier 5 and both.

As can be seen above, the power efficiency of the common amplifier in accordance with the fifth embodiment is increased by 2.8% compared to that of the conventional common amplifier shown in FIG. 10.

The saturation output of the carrier amplifying circuit 4 may be either same as or different from that of the peak amplifying circuit 5. Further, although the common amplifier described above has a two-stage configuration, the common amplifier in accordance with this embodiment may have n-stage (n>2) configuration so that the gain can be enhanced while maintaining the efficiency. In this case, as for the preamplifiers for peak amplification, although all of them may be biased in class-C, it is also possible that only the one at the front end is biased in class-C.

Besides, the common amplifier in accordance with this embodiment may include a control circuit for controlling the gain or the phase of the peak amplifying circuit 4 and the peak amplifying circuit 5 in order to properly distribute the effect of the load impedance between the peak amplifying circuit 4 and the peak amplifying circuit 5 or optimize the performance of the Doherty amplifier. In this case, it is more preferable that the control circuit is installed in an earlier-staged preamplifier among a series of preamplifiers. In this way, the performance of the Doherty amplifier can be enhanced while suppressing the power loss in the control circuit. The control circuit may electrically control the gain or the phase using, e.g., a PIN diode or a variable capacitive diode.

Figure 13:
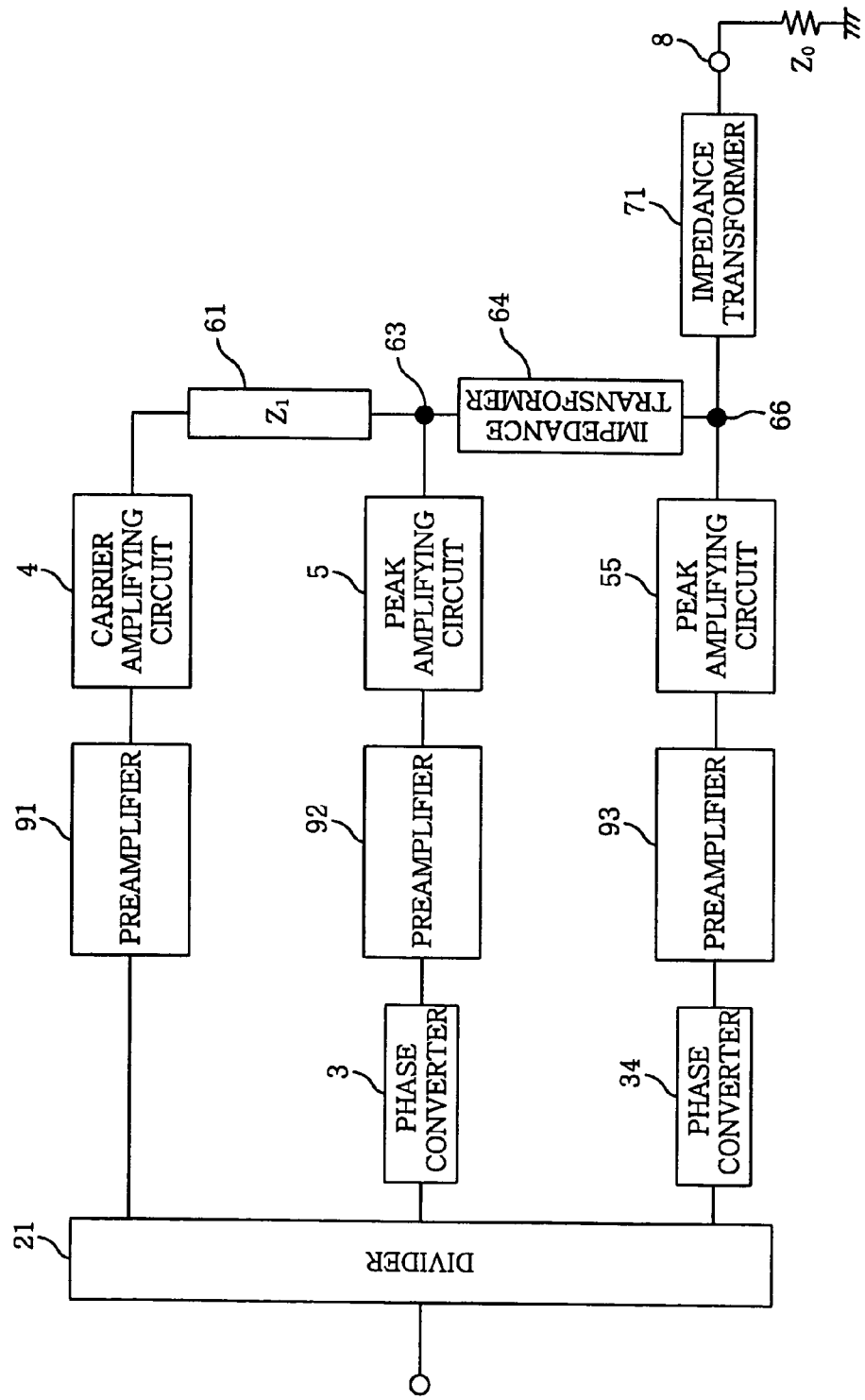
FIG. 13 depicts a configuration diagram of a common amplifier in accordance with a sixth embodiment of the present invention.

FIG. 13 depicts a configuration diagram of a common amplifier in accordance with a sixth embodiment of the present invention. The common amplifier of sixth embodiment differs from that of the fifth embodiment in that it is configured such that outputs of three amplifying circuits are combined to be outputted. In FIG. 13, components that have same reference numerals as FIG. 12 have same specifications as those in FIG. 12.

A divider 21 divides an input signal into three divided signals. One of the divided signals is inputted to the preamplifier 91, another divided signal is inputted to the phase converter 3, and the other divided signal is inputted to another phase converter 34. The phase converter 3 makes a phase of an output signal of the λ/4 transformer 61 be equal to that of the peak amplifying circuit 5 when combining the output signal of the λ/4 transformer 61 with that of the peak amplifying circuit 5 at a node 63. The phase converter 34 makes a phase of an output signal of the impedance transformer 64 be equal to that of another peak amplifying circuit 55 when combining the output signal of the impedance transformer 64 with that of the peak amplifying circuit 55 at a node 66.

The reference numerals 91, 92 and 93 represent preamplifiers. The divided signal inputted to the preamplifier 91, 92 and 93 are respectively amplified by the amplifying circuit 4, 5 and 55. The output signal of the carrier amplifying circuit 4 is combined with the output signal of the peak amplifying circuit 5 via the λ/4 transformer 61 at the node 63. Thereafter, this combined signal is combined with the output signal of the peak amplifier 55 via the impedance transformer 64 at the node 66. The impedance transformer 71 transforms an output impedance of the amplifier into Zo.

Although not shown in the drawings, if we compare the sixth embodiment to an assumed configuration where a common amplifier including three amplifying circuits has preamplifiers before an input signal is divided to be inputted to a peak amplifying circuit or a driving circuit in a manner similar to FIG. 10, the absolute value of the dividing loss is reduced and the power added efficiency is enhanced by respectively inserting the preamplifiers 91 to 93 before the respective amplifying circuits 4, 5 and 55 as shown in FIG. 13. This result will be apparent to those skilled in the art with reference to the description of the sixth embodiment, although it is not described in detail.

The configuration of the peak amplifying circuit 55 is basically same as that of the peak amplifying circuit 5, except that its operating point is set such that it starts to operate at a higher input level than the peak amplifying circuit 5. The impedance transformer 64 contains a transmission line, whose configuration is similar to that of the λ/4 transformer 61. It is also possible to replace the λ/4 transformer 61 or the impedance transformer 64 with other kind of devices as long as impedance matching can be implemented.

Hereinafter, the operation of the common amplifier shown in FIG. 13 will be described. When an input level thereof is not high enough to make the peak amplifying circuit 55 operate, the output signal of carrier amplifying circuit 4 in the common amplifier shown in FIG. 13 is substantially same as that in the common amplifier shown in FIG. 12, and the output signal of peak amplifying circuit 5 in the common amplifier shown in FIG. 13 is substantially same as that in the common amplifier shown in FIG. 12. Therefore, in this case, the combined signal at the node 63 in FIG. 13 is substantially same as the combined signal at the node 62 in FIG. 12. Further, the load impedance of the peak amplifying circuit 55 is practically infinite. The impedance transformer 64 transforms an output impedance seen from the node 63 to transfer its effect to the node 66. Thus, when the preamplifier 92 and/or 93 does not operate, the dividing loss is reduced.

When the input level is high enough to have the peak amplifying circuit 55 saturated, an input impedance seen from the impedance transformer 64 increases, so that the output impedance seen from the node 63 becomes such that the supplied power can be transferred efficiently. Thus, the output power of the common amplifier is almost equally distributed to the amplifying circuits 4, 5, and 55.

The behavior of the common amplifier of FIG. 13 at the input level to have the peak amplifying circuit 55 start to operate can be easily understood by handling the combination of the amplifying circuits 4 and 5 in the common amplifier of FIG. 13 as if it were the carrier amplifying circuit 4 in the common amplifier of FIG. 12.

Although a Doherty combiner is constituted by the $\lambda/4$ transformer 61, the impedance transformer 64 and the node 63 and 66 in accordance with the sixth embodiment, other configurations, e.g., a configuration including only a single node, can also be applied therein. Further, the number of the divided signals that are combined by the Doherty combiner may be greater than 3. In addition, it is also possible to combine a plurality of preamplifiers into a single one and let the divided signals share it. As described above, by respectively inserting the preamplifiers 91 to 93 in front of the amplifying circuits 4, 5 and 55, the absolute value of the dividing loss is reduced when the peak amplifying circuits 5 and 55 does not operate so that the power added efficiency is enhanced.

In accordance with the multi-stage amplifiers of the fifth and sixth embodiment, the power efficiency of the amplifier can be made close to the collector efficiency of the Doherty amplifier by dividing the input signals when the input level is low to suppress the dividing loss.

The terms "class-A", "class-AB', "class-B' and "class-C" used in this specification should be construed to define only bias condition based on idle current and be compatible with operating classes based on a configuration of the output matching circuit such as "class-F".

The present invention can be implemented by any means, any circuits or any apparatuses. A plurality of circuits can be used for implementing a single function, and a plurality functions can be implemented by a single circuit. Further, the functions or configurations in the preferred embodiments of the present invention should not be construed to be essential in the present invention.

While the invention has been shown and described with respect to the preferred embodiments, it will be understood by those skilled in the art that various changes and modification may be made without departing from the spirit and scope of the invention as defined in the following claims.

What is claimed is:

1. A Doherty amplifier for combining outputs of a plurality of amplifying circuits to generate an amplifier output, comprising:
    a first amplifying circuit for operating a first amplifying device in class-AB, wherein the first amplifying circuit is one among the plurality of the amplifying circuits, and the first amplifying circuit includes an output matching circuit at an output side thereof;
    a second amplifying circuit for operating a second amplifying device in class-B or class-C, wherein the second amplifying circuit is one among the plurality of the amplifying circuits; and
    a summing node at which an output of the first amplifying circuit is combined with an output of the second amplifying circuit via a first impedance transformer containing a transmission line and the impedance transformer is other than a multiple of $\lambda/4$,
    wherein when a load impedance value of the output matching circuit is substantially equal to an impedance value of the first impedance transformer, an output power of the output matching circuit is a maximum power of the first amplifying circuit, and
    wherein an electrical length of the transmission line is adjusted so that an amplifying efficiency of the first amplifying circuit is maximum within an input level region where the first amplifying circuit operates alone and
    wherein between a second output matching circuit of the second amplifying circuit and the summing node is a straight line.

2. A Doherty amplifier for combining outputs of a plurality of amplifying circuits to generate an amplifier output, comprising:
    a first amplifying circuit for operating a first amplifying device in class-AB, wherein the first amplifying circuit is one among the plurality of the amplifying circuits, and the first amplifying circuit includes an output matching circuit at an output side thereof;
    a second amplifying circuit for operating a second amplifying device in class-B or class-C, wherein the second amplifying circuit is one among the plurality of the amplifying circuits; and
    a summing node at which an output of the first amplifying circuit is combined with an output of the second amplifying circuit via a first impedance transformer containing a transmission line and the impedance transformer is other than a multiple of $\lambda/4$,
    a $\lambda/4$ transformer which transforms an input impedance of the $\lambda/4$ transformer seen from the summing node into an output load impedance,
    wherein an impedance value of the first impedance transformer is twice an impedance value of the $\lambda/4$ transformer seen from the summing node,
    wherein when a load impedance value of the output matching circuit is substantially equal to an impedance value of the first impedance transformer, an output power of the output matching circuit is a maximum power of the first amplifying circuit, and
    wherein an electrical length of the transmission line is adjusted so that an amplifying efficiency of the first amplifying circuit is maximum within an input level region where the first amplifying circuit operates alone and
    wherein between a second output matching circuit of the second amplifying circuit and the summing node is a straight line.

3. A Doherty amplifier of claim 1 further comprising:
    a divider for dividing an input signal of the Doherty amplifier into a plurality of divided signals which include a first and a second divided signals for the first and the second amplifying circuits.

4. A Doherty amplifier of claim 2 further comprising:
    a divider for dividing an input signal of the Doherty amplifier into a plurality of divided signals which include a first and a second divided signals for the first and the second amplifying circuits.

* * * * *